United States Patent [19]

Acosta et al.

[11] Patent Number: 4,479,980

[45] Date of Patent: Oct. 30, 1984

[54] PLATING RATE MONITOR

[75] Inventors: Raul E. Acosta, White Plains; Edward J. Yarmchuk, Purdys, both of N.Y.

[73] Assignee: International Business Machines Corporation, Armonk, N.Y.

[21] Appl. No.: 562,390

[22] Filed: Dec. 16, 1983

[51] Int. Cl.³ ........................... C23C 3/00; C23C 3/02
[52] U.S. Cl. ..................................... 427/10; 204/228; 204/406; 204/434; 324/DIG. 1; 364/468; 364/500; 364/563
[58] Field of Search ................. 427/10; 204/1 T, 228, 204/231, 406, 434; 324/DIG. 1; 368/114; 364/468, 500, 563, 184, 185

[56] References Cited

U.S. PATENT DOCUMENTS 2,978,364  4/1961  Blaustein ............................. 427/10
3,669,868  6/1972  Lieber et al. ....................... 204/228
4,350,717  9/1982  Araki et al. ........................ 427/10 X Primary Examiner—Michael R. Lusignan
Attorney, Agent, or Firm—Pollock, Vande Sande & Priddy

[57] ABSTRACT

A plating rate monitor includes a Wheatstone bridge, one branch of which is a monitoring resistor formed on a printed circuit board located in the same environment as an object being plated. The resistor undergoes plating at the same rate as the object. Each time the bridge becomes balanced, another resistor branch of the bridge, which is variable, is incremented by a preselected value to upset the balance. As the monitoring resistor in the plating environment undergoes plating, a change in its resistance causes the bridge to become balanced once again and the time interval for achieving this balance, for a calculated plating thickness change of the monitoring resistor, determines the plating rate.

14 Claims, 8 Drawing Figures

OPERATION FLOWCHART

OPERATION FLOWCHART

PLATING RATE MONITOR

DESCRIPTION

1. Technical Field

The present invention relates to printed circuit board fabrication and more particularly to continuous monitoring of metal plating rate during such fabrication.

2. Brief Description of the Prior Art

In the field of printed circuit board fabrication by electroless deposition, there are no known means for continuously measuring the rate of metal plating in a precise manner. A common technique presently used to control the operation of electroless plating baths is a gravimetric approach wherein the increase in conductor thickness is calculated from the weight gain of a monitor coupon. The rate of plating in electroless processes is relatively slow. Typically, it ranges from 1 to 5 μm/hr. Consequently, the gain in weight occurs slowly and measurements must be taken after relatively long periods of time have elapsed, approximately one hour apart. In order to perform the weight measurement, the monitor coupon must obviously be removed from the plating solution at each time interval. This prior art method of determining plating rate suffers from various disadvantages. A first disadvantage resides in the fact that the measurement cannot be continuous because the rate of plating must be measured after fairly long periods of time have elapsed.

The second disadvantage is that the prior art method is of limited accuracy. The monitor coupons must be rinsed and dried carefully after each measurement to avoid errors, since very small differences in weight must be determined.

Typically, each measurement involves only a few percent weight gain of the coupon. An additional disadvantage is that this prior art approach is subject to large errors. The initiation of electroless plating, even on "identical" substrates, may be delayed due to the formation of oxide films which are undetectable to the eye. Further uncertainty is added to the measurements due to the necessity of intermittently removing the monitor coupon from the bath.

U.S. Pat. No. 2,978,364, issued to Blaustein on Apr. 4, 1961, recognizes the usefulness of a Wheatstone bridge in controlling the deposition of a resistive material during the fabrication of a thin film resistor. In this prior art reference, the connection of a resistive coating in a Wheatstone bridge is simply made by a pair of wires running from the bridge to the thin film member, upon which a resistive coating is to be deposited. As the resistive coating increases, the bridge approaches a balanced condition and, theoretically, when balancing is achieved, the control circuit terminates further vacuum deposition thereby leaving a coating of selective resistive value. A disadvantage of this approach is encountered as a result of the finite electrical resistance of the connecting leads which results in an erroneous measurement of the sample resistance. Accordingly, although this error may be acceptable in the manufacture of thin film resistors of moderate to high resistance value, where the effect of lead resistance errors will be negligibly small, they are unacceptable for measuring plating rates of conductors wherein resistance values are in the range of 1 ohm or less.

The approach taken by Blaustein would be inappropriate for a bath plating process because there is no provision for automatically compensating for resistance changes as a result of temperature variations in the bath. These temperature variations cause commensurate changes in resistance which would affect the balance of the bridge as if there were changes in deposited material on the sample undergoing plating.

BRIEF DESCRIPTION OF THE PRESENT INVENTION

The present invention is directed to a method and instrumentation for accurately measuring the rate of plating on objects such as conductors on printed circuits.

In the present invention a resistor strip on a monitor printed circuit board is located in a plating environment with an object undergoing plating, such as a separate printed circuit. The monitor resistive strip is connected as a first arm in a Wheatstone bridge. A second similar resistive strip on the monitor printed circuit board is connected as a second bridge arm and is treated with resist so that it remains unplated during the process thereby acting as a reference. Because both of these resistive strips remain in the bath automatic compensation of temperature variations is achieved. A fixed resistor constitutes a third arm of the bridge while a computer controlled variable resistor completes the fourth arm of the bridge. Each time the bridge becomes balanced, the variable resistor is incremented by a preselected value to upset balance. As the monitoring resistive strip undergoes plating, a change in its resistance causes the bridge to balance again and the time interval for achieving this balance, for a calculated thickness change in the resistive monitor, determines plating rate.

Unlike the prior art gravimetric approach, the printed circuit need not be removed from the bath in order to calculate weight gain. Further, the present invention permits relatively short measurement intervals between bridge nulls, typically less than one minute thus obviating the long measurement period necessary with the gravimetric monitoring approach. These features of the present invention achieve a much higher accuracy of measurement than is possible with the gravimetric approach.

Further, the present invention achieves results unobtainable by the previously discussed patent to Blaustein. As will be explained hereinafter, the present improvement offers a significantly novel type of lead configuration which virtually eliminates lead resistance as a source of error. Further, the monitor resistive strip undergoing plating as well as the conductive strip treated with resist are immersed in the bath and are similarly affected by temperature changes thereof. As a result, automatic temperature compensation occurs permitting actual resistive measurements by the Wheatstone bridge as a result of conductor plating, as opposed to resistor changes as a result of temperature variations. This capability is of great importance inasmuch as a change of only one degree Centigrade produces a resistance change, in a copper line, which is about three times greater than the resistance change due to the plating of copper during a 100 second interval.

Furthermore, AC current is employed to drive the bridge with means included therein for accomplishing phase rejection thereby eliminating errors introduced by electrical noise in the system.

Consequently, the present invention is a distinctive improvement over the prior art and presents a novel method and instrumentation for accurately measuring the varying resistance of a plating conductor, with due compensation of temperature variations and with the elimination of errors introduced by the finite resistance of leads connecting the component resistors in a Wheatstone bridge arrangement. A computer controlled variable resistor enables rapid adjustments in the balance of the Wheatstone bridge so that continuous monitoring of plating rate may be achieved.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
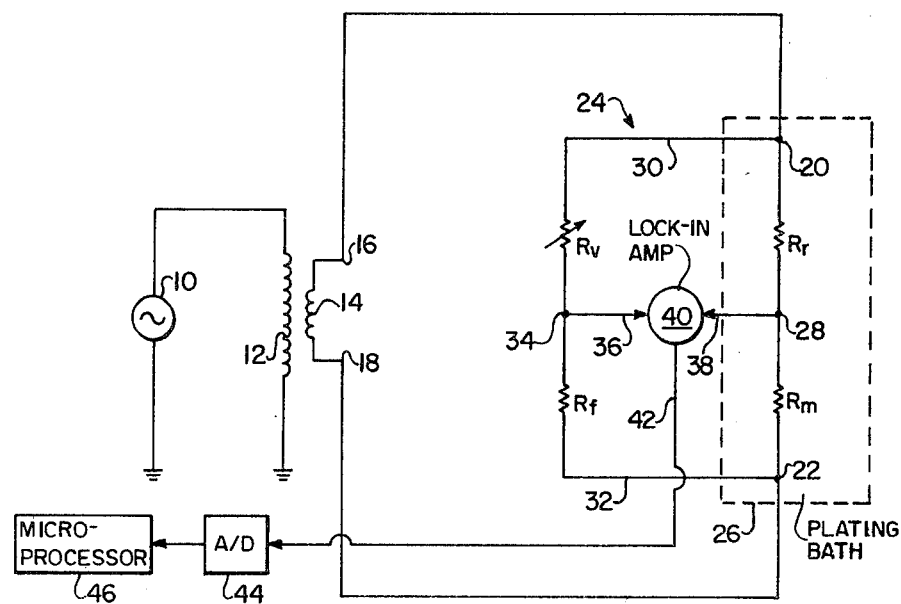
FIG. 1 is a circuit diagram of a bridge circuit as employed in the present invention.

The present invention proposes a method and apparatus for achieving continuous measurement of plating rate achievable during short intervals of less than one minute. Reference is made to FIG. 1 wherein an audio oscillator 10 is connected across the primary winding 12 of an isolation and impedance matching transformer. The secondary winding 14 is connected at its output terminals 16 and 18 to the input terminals 20 and 22 of a Wheatstone bridge 24. Typically, the audio oscillator 10 may generate a signal which is 1.0 v RMS operating at a frequency of 200 Hz. The bridge circuit includes a plating monitor in the form of a resistor $R_m$ which is placed in a plating environment. Thus, it may be immersed in an electroless plating bath indicated by reference numeral 26. The plating bath would also contain printed circuit boards or other objects undergoing electroless plating. It must be emphasized at this point that, although the following description of the invention is explained in connection with an electroless plating process, the invention has equal applicability to electroplating, vacuum deposition or other plating processes. A second resistor $R_r$ is immersed within plating bath 26 and shares a junction 28 with $R_m$. The outer terminal of $R_r$ is connected to bridge input terminal 20 while the outer terminal of $R_m$ is connected to the bridge terminal 22 so that these resistors form two branches of a bridge. $R_r$ is substantially identical with $R_m$ but has a resist material applied to its surface so that plating will not occur thereon. Because $R_r$ and $R_m$ have matched resistance coefficients, automatic temperature compensation is realized for changes in resistance due to temperature variations of the plating bath. This is due to the fact that it is the ratio of the two resistances $R_r$ and $R_m$ which determines the bridge balance point. A fixed resistor $R_f$ and a variable resistor $R_v$ form the other two arms of the bridge circuit and are not present within the plating bath 26. These latter-mentioned resistors have a common junction 34 while the outward terminal of $R_v$ is connected with the input bridge terminal 20 and the outward terminal of $R_f$ is connected in parallel with the bridge input terminal 22. By choosing the value of $R_f$ to be much greater than the resistance of the wires 30, 32, leading to the monitor and reference resistors $R_r$ and $R_m$, the effect of the leads on the bridge balance is minimized.

A conventional lock-in amplifier 40 has its input terminals 36 and 38 respectively connected to bridge junctions 34 and 28 to complete the circuit connections within the bridge 24. In order to ensure that the effect of the leads on bridge balance is made negligible, it is important that the wiring be connected as shown in FIG. 1. This is due to the fact that this configuration, with five wires leading to the plating bath 26, ensures that the wire impedances are included in series with the high-value resistors $R_f$ and $R_v$ rather than with $R_r$ and $R_m$.

During operation of the bridge, an imbalance is detected by the lock-in amplifier which is phase-locked to the drive signal from audio oscillator 10. This provides high noise rejection and allows the bridge to operate in electrically noisy environments. Further, the frequency of the A.C. bridge drive current can be made high enough so that electrical potential differences developed across $R_m$ have no electrochemical effect. In this respect, it should be noted also that the magnitude of these potential differences can be kept as small as several millivolts RMS.

Figure 6:
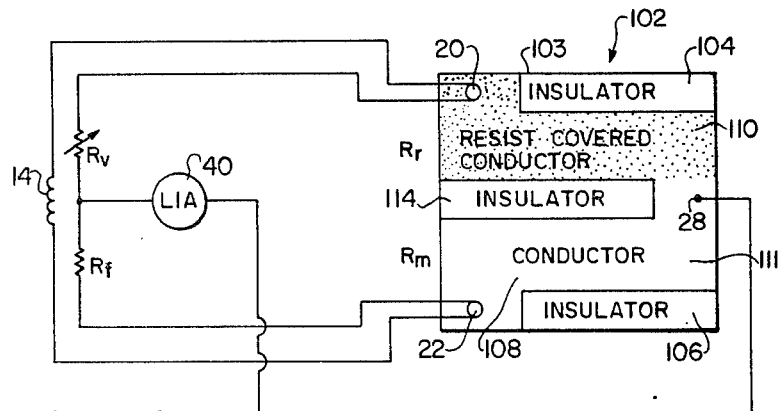
FIG. 6 is a schematic illustration of a printed circuit board having reference and monitor resistors thereon which are connected as arms of the bridge of the present invention.

With the circuit as shown in FIG. 1, $R_v$ is proportional to the inverse of $R_m$ whenever the bridge is balanced. The relationship between $R_m$ and the plated thickness depends upon the geometry of $R_m$. In a preferred embodiment of the invention, as shown in FIG. 6 and discussed hereinafter, $R_m$ is initially a simple conductive element of rectangular geometry having a fixed width and length. The thickness of $R_m$ increases with plating and the resistance of $R_m$ is inversely proportional to its thickness. Changes in $R_v$ at bridge balance will be directly proportional to changes in thickness. Thus, by measuring the rate of change of $R_v$ between bridge balance points, one can determine the plating rate. The constant of proportionality can either be calculated from $R_f$, $R_v$, $R_r$ prior to plating or can simply be measured during a test run by making a comparison with the results of a simultaneous gravimetric measurement. For geometries other than simple rectangles, the relation between $R_m$ and the plating thickness will be more complex. However, once this is determined, one can extract the plating rate from measurements of $R_v$. Bridge balance could be maintained by manually adjusting a decade resistor. However, the amount of operator attention required can be greatly reduced by using microprocessor control of a digital resistor.

Figure 2:
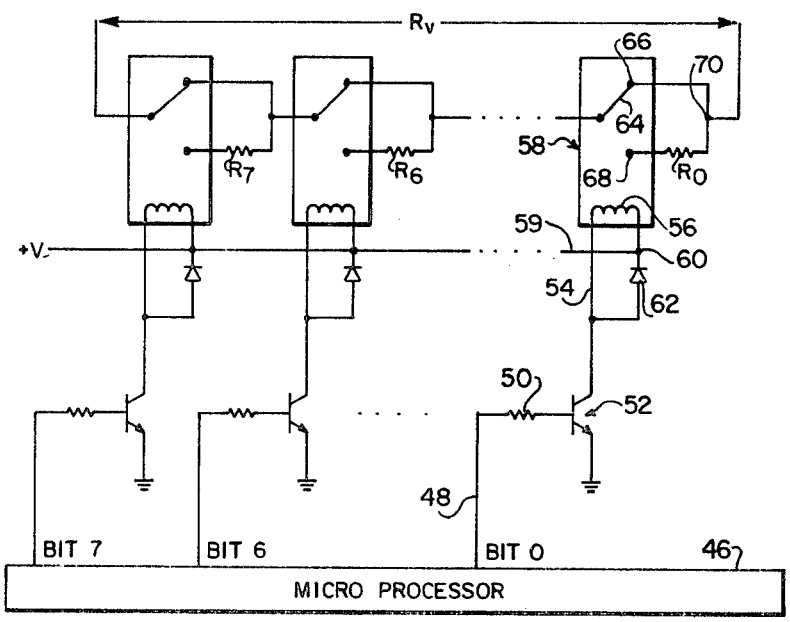
FIG. 2 is a schematic diagram of a series binary resistor chain which constitutes the variable resistor of the bridge illustrated in FIG. 1.

FIG. 2 illustrates $R_v$ in the form of a digital resistor, wherein a microprocessor 46 has a port with a number of output bits, for example the illustrated eight bits (0-7). In the circuit the microprocessor controls a series of relays which switch the members of a binary resistance chain in and out of the circuit to produce the desired overall resistance. For example, if the value of $R_v$ is to be set to equal $R_0$, the microprocessor 46 sets the zero bit output port line 48 to a high condition which initiates an input signal to NPN transistor 52, through coupling resistor 50. A terminal of a SPDT relay coil 56 is connected to the transistor collector via lead 54. The opposite terminal of the coil 56 is connected in parallel with the cathode of a spike protection diode 62, the anode of which is connected to the transistor collector. Transistor 52 amplifies the signal appearing along the bit zero line 48 and energization of coil 56 causes relay wiper 64 to move from the normally shorting contact 66 to contact 68 which introduces the series resistor $R_0$ between contact 68 and resistor stage terminal 70. If the zero bit line 48 is the only line which is set high, the wipers of the remaining SPDT relays remain in an interconnecting series shorting position so that the total resistance across the resistor chain ($R_v$) is the resistance of $R_0$. It is desirable for the resistor chain to operate in a binary fashion so that the resistance of each stage $R_0$–$R_7$ is twice that of the previous stage. Thus, for example, if $R_0$ is equal to 250 ohms, $R_6$ is equal to 16,000 ohms and $R_7$ is equal to 32,000 ohms.

The automated measurement of plating rate will now be explained. Printed circuit boards or other objects (not shown) to be plated are inserted in a plating bath or environment along with monitoring resistor $R_m$ and $R_r$. Initially, $R_v$ is incremented to a sufficient value to cause a decidedly unbalanced bridge. This is detected by connecting the output 42 of the lock-in amplifier 40 to an analog-to-digital voltage converter 44, the output of which furnishes the input of microprocessor 46 with an accurate digital measurement of the bridge output voltage. This is graphically illustrated at point 72 in FIG. 3. In a typical start-up procedure, the output port of microprocessor 46, shown in FIG. 2, may be set so that bit 3 and bit 5 are both set high. This results in the inclusion of only $R_5$ and $R_3$ in the series connection constituting $R_v$. For example, in the event $R_5$ is equal to 8,000 ohms and $R_3$ is equal to 2,000 ohms, in true binary fashion, the total initial resistance of $R_v$ is equal to 10,000 ohms. As plating of $R_m$ progresses, its resistance decreases and the bridge output detected by the analog-digital converter 44 approaches zero, along a generally linear ramp function. The time for this to occur is defined by an initial interval "A" as indicated along the time axis of FIG. 3 corresponding with the binary representation of the microprocessor output port during interval "A" as tabulated in the truth table of FIG. 4.

Figure 3:
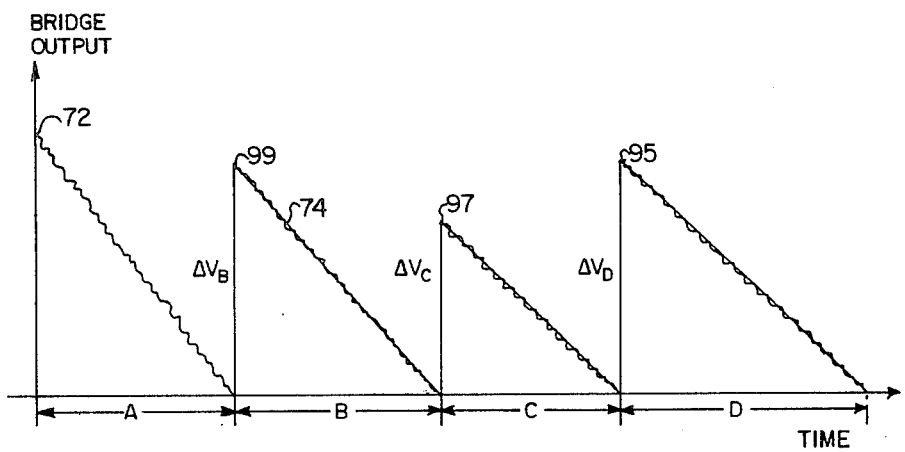
FIG. 3 is a graphical plot illustrating the bridge output detected during a plating operation monitored by the present invention.
Figure 4:
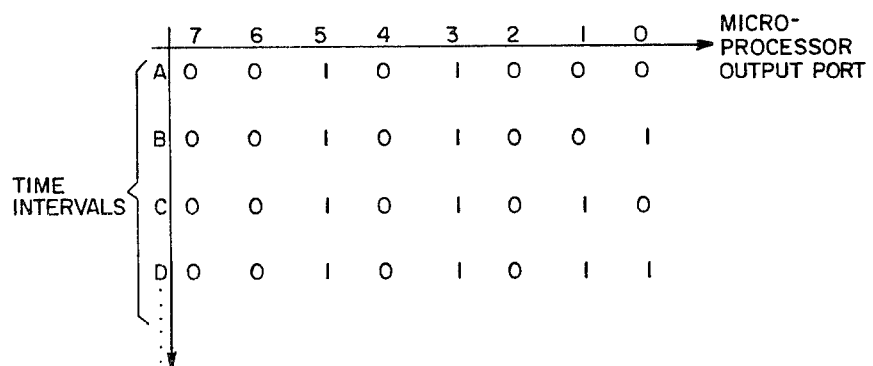
FIG. 4 is a truth table indicating the variable resistor states of the resistor shown in FIG. 2 at different time intervals during a monitored plating process.

When balance occurs at the end of interval "A", as detected by the analog-to-digital converter 44, the microprocessor recognizes this condition and generates a new signal at its output port by increasing the least significant bit by a binary 1, as indicated in FIG. 4, to increment $R_v$ accordingly and to initiate time interval "B". During interval "B" resistor $R_0$ is added to resistors $R_5$ and $R_3$ resulting in a total resistance $R_v$ of 10,250 ohms. This results in a step increase of the bridge output ($\Delta V_B$) as shown in FIG. 3. During time interval "B" the bridge output again decreases as a ramp function until the bridge again becomes balanced due to the increased plated thickness of $R_m$ at the end of interval "B". At this new balance point, a thickness change of the plating has occurred on $R_m$ which may be expressed as:

$$\Delta T = (\rho_m L_m / w_m R_r) \times (250\Omega / R_f)$$

wherein $\rho m$ equals the resistivity of $R_m$; $L_m$ is equal to the length of a rectangularly shaped $R_m$; $w_m$ is equal to the width of rectangularly shaped $R_m$; 250 is equal to the increase in $R_v$; and $R_f$ is the fixed resistor value which is 10,000 ohms, by way of example.

Referring back to FIG. 4, it will be appreciated that each time the bridge output becomes balanced, $R_v$ is increased in binary fashion. The above expression for thickness change is constant for each of the intervals. All of the parameters of this expression remain the same but it is the elapsed time between intervals which varies. The microprocessor easily measures the elapsed time between successive bridge balance intervals and if the rate is above or below a preselected range, an appropriate conventional alarm (not shown) may be employed for signalling the necessity for corrective action.

When the end of interval "B" is reached, $R_v$ is incremented to the new binary state indicated in FIG. 4 thus beginning interval "C" which, in our example, increases $R_v$ by 250 ohms once again. At the end of interval "C", the thickness of the plating on $R_m$ has increased by the same amount as has occurred during interval "B" but the time during interval "C" for this to have occurred may not be the same. Thus, it is normally expected that the plating rates, during these intervals, will vary.

In the present invention maximum accuracy is obtained by actually measuring the bridge output several times during each of the indicated time intervals indicated in FIG. 3. By using well-known probability and mathematical statistic techniques, a precise linear approximation of data points collected during each bridge output interval may be determined as indicated by reference numeral 74 in FIG. 3. By achieving an approximated "running fit", it is possible to obtain a more precise value of the jumps in bridge output between time intervals ($\Delta V_B$, $\Delta V_C$, etc.). This is difficult to obtain with actual measurements because the incremental step or leading edge of each ramp function is actually rounded due to the frequency response of the bridge. Employing a "running fit" technique, relying upon multiple measurements during each time interval, assures greater precision because the effect of occasional spurious measurements during an interval will be minimized. Implementation of the "running fit" linear approximation will be clear to those skilled in the art and follows well-known probability and mathematical statistic theory as disclosed in INTRODUCTION TO PROBABILITY AND MATHEMATICAL STATISTICS, by Z. W. Birnbaum, published by Harper & Brothers, New York, 1962.

Figure 5:
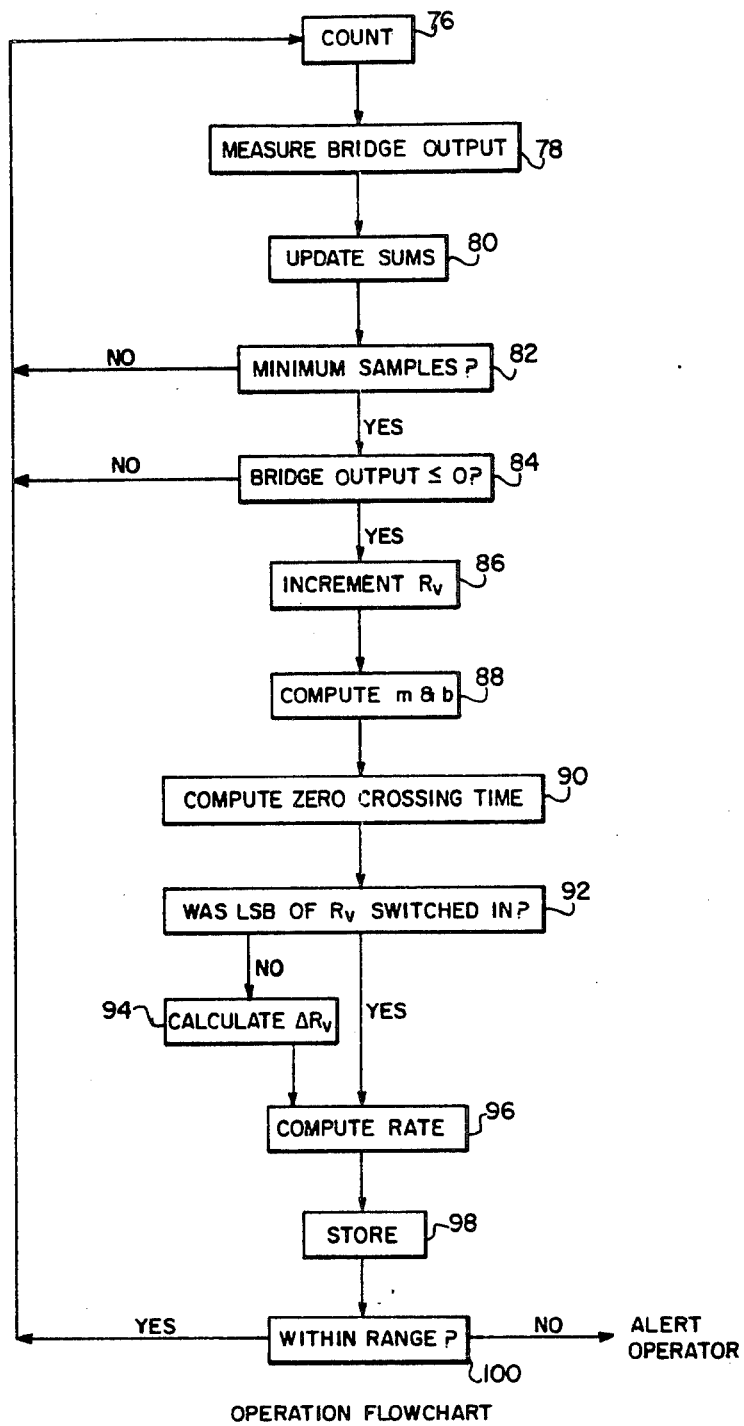
FIG. 5 is a simplified flow chart depicting the operational steps of the present invention.

FIG. 5 is a simplified operation flow chart of the system as previously described. The various flow chart steps are implemented by microprocessor 46. During initial step 76 a preselected time interval elapses prior to execution of following steps. Typically, the elapsed interval may be one second. After this time has elapsed, the analog-to-digital converter 44 (FIG. 1) measures bridge output voltage step 78 and this is added to a statistical summation process at step 80 for accomplishing the straight line fit previously discussed. It is anticipated that execution of all steps in the flow chart will take less than one second so that the bridge output voltage may be measured 60 times per minute. Thus, the bridge output voltage plotted in FIG. 3 may be measured 60 times during each indicated interval. At the conclusion of this typical one minute interval, respective summations are made of bridge output voltage, elapsed measurement time and the product of measured bridge output voltage and elapsed measurement time. These summations are employed in the statistical technique as previously discussed for determining the slope and Y-axis intercept ($\Delta V_B$, $\Delta V_C$, etc.) for each of the ramp functions during intervals "A", "B", "C", etc., shown in FIG. 3. At this point in the flow chart, step 82 determines whether a minimum number of measurements have been taken of the bridge output voltage. Typically, the minimum number will be ten. This prevents an erroneous "running fit" based upon a few spurious measurements. In the event a minimum number of measurements have not been made, the program is returned to the initial count step 76. If the minimum number of measurements has occurred, the bridge output voltage is measured to determine whether a balanced bridge has been reached (step 84), which occurs if the analog-to-digital converter 44 measures a value less than or equal to zero. In the event this has not occurred, the program is returned to the counting step 76 to collect another data point of measured bridge output voltage. In the event step 84 determines bridge null has been achieved, step 86 occurs wherein $R_v$ is incremented as previously discussed in connection with FIGS. 2-4. The first time this step in the flow chart is executed, the first monitored interval "A" has occurred and the least significant bit resistor $R_0$ (FIG. 2) is switched from binary zero to binary 1, as indicated in the truth table of FIG. 4.

Each of the ramp functions shown in FIG. 3, considered relative to its time interval "A", "B", etc., may be expressed by the usual formula for a straight line:

$$y = mx + b,$$

where m is the slope of the line and b is the Y axis intercept displaced to the beginning of each corresponding time interval. During step 88 the slope and displaced Y intercept for each interval are computed, in accordance with the "running fit" discussed, from the data points collected during that time interval. From the computed slope and Y intercept, a zero time axis crossing (bridge null) is computed at step 90. As previously mentioned, the advantage of relying upon a "running fit" computed null point lies in the fact that it is predicted on the basis of many collected data points during an interval as opposed to actual measurement which might result in the detection of an erroneous null point due to noise or spurious signals at the very low voltage levels around the null point.

By observing FIG. 4 is it noted that, during interval "B", "D" and for every other "even" time interval, the least significant bit of the microprocessor output port will have changed from a binary zero to a binary 1 while the states of the other binary bit positions have not changed. Thus, during the transition from odd to even intervals, the same predictable resistor ($R_0$) is added. However, when transferring from "even" to "odd" intervals (e.g., interval "B" to "C"), FIG. 4 indicates that more than one resistor will be switched into or out of the resistor chain $R_v$, which results in cumulative errors because there will be some resistance variations between $R_0$-$R_7$ unless very high precision resistors are used. In order to avoid the inordinate expense of constructing $R_v$ from very high precision resistors, greater weight is given to the measurements made during the "even" intervals as will be presently explained.

During step 92 an event is noted when the least significant bit ($R_0$) of $R_v$ is switched in. Referring to the truth table of FIG. 4, and as previously explained, this occurs during the "even" time intervals. If the answer during step 92 is positive, we know the change in $R_v$ during the just completed interval is equal to $R_0$ and the rate of plating is computed at step 96 as a function of this change.

In the event step 92 results in a negative determination, the system is operating in the transition from an "even" to "odd" interval. To increase the accuracy of measurement during this interval, the present invention utilizes a calculated value of $\Delta R_v$. This is indicated during step 94 of the flow chart of FIG. 5. Briefly, during step 94 calculated $\Delta R_v$ is determined by the formula:

$$\Delta R_v = R_0 \times (b/b_p)$$

wherein $R_0$ is the least significant bit resistor of $R_v$; $\Delta R_v$ is the change in $R_v$ occurring at the outset of the last completed "odd" interval; b is the displaced Y-axis intercept occurring at the outset; and $b_p$ is the displaced Y-axis intercept during a previous "even" interval.

By way of example, referring to FIG. 3, at the conclusion of interval "C", $\Delta R_v$ is calculated as being equal to $R_0$ multiplied by the displaced Y-axis intercept 97 divided by the previous displaced Y-axis intercept 99.

The rate as a function of time is stored during step 98 in the microprocessor. Also, each rate as newly computed is compared with limits stored in the microprocessor and in the event the computed rate is outside a predetermined range, as indicated at step 100, a visual or audio signal may alert an attendant. In the event it is within range, the flow chart routine reiterates to the initial count-step 76 which permits the determination of plating rate during a succeeding time interval.

FIG. 6 illustrates a preferred embodiment for the fabrication of $R_r$ and $R_m$ previously discussed in connection with FIG. 1. Referring to FIG. 6, a printed circuit 102 includes a generally rectangular board 103. Side insulator portions 104 and 106 of rectangular geometry are positioned in parallel spaced relationship to a centrally disposed insulator strip 114. A generally U-shaped continuous conductor of predetermined resistance completes the printed circuit 102 and includes arms 108 and 110 connected by a bight section 111. The continuous conductor may be etched in conventional fashion on the printed circuit board 103. Resistor $R_r$ results from the coating of conductor arm 110 with an appropriate resist material which will not undergo plating when exposed to plating such as when it is submerged in bath 26 (FIG. 1). The remaining conductor arm 108 constitutes $R_m$ (FIG. 1) which is identically dimensioned with respect to $R_r$ so that both conductors present identical resistance to the bridge circuit. Automatic temperature compensation for the bridge results when temperature variations in the plating bath 26 occur because the bridge balance point depends upon the ratio of the two resistances. The conductor arms 108 and 110 offer sufficient surface area to permit connection of the five illustrated circuit leads thereto at junction points 20, 22 and 28. This connection minimizes the effect of lead resistance on the measurements.

Figure 7:
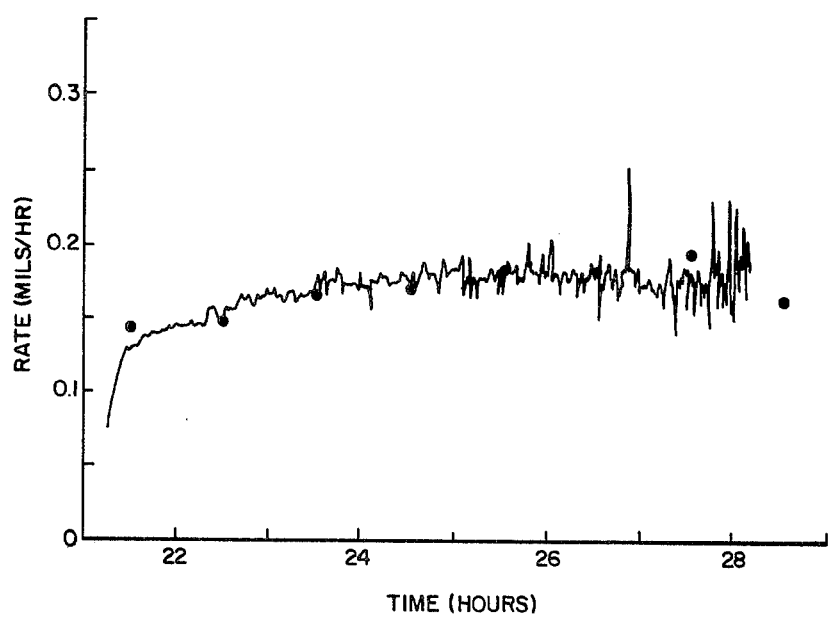
FIG. 7 is a plot of plating rate as a function of time, as observed during monitoring by the present invention.

FIG. 7 illustrates a plot of plating rate as a function of time plotted from the stored values collected during step 98 of FIG. 5. An accurate comparison is seen to exist with gravimetric measurements made during the same time interval as indicated by the solid circles on the plot, typically computed at the midpoint of hour-long intervals.

Figure 8:
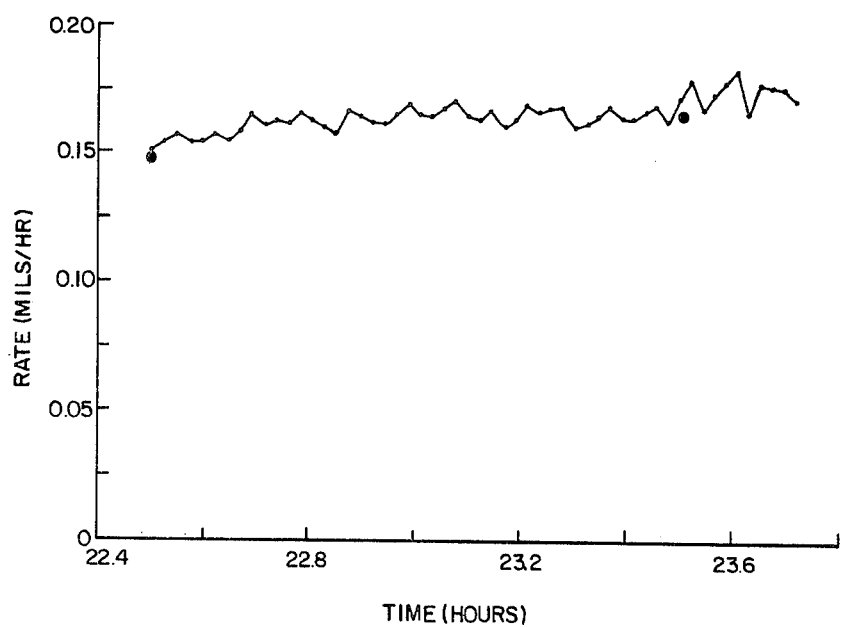
FIG. 8 is a plot illustrating an expanded portion of the plot shown in FIG. 7.

FIG. 8 is an expanded view of the plot shown in FIG. 7, shown over a time interval approximately equal to one hour. The points indicated along the plotted line indicate individual computed rate points resulting each time step 96 (FIG. 5) is executed which typically occurs at approximately 60 times per hour.

As will be appreciated from reviewing the results shown in FIGS. 7 and 8, the present plating rate monitoring system compares quite favorably with measurements made during a conventional gravimetric process. However, the present invention offers the distinct advantage of rapid and continuous measurements providing a system operator with the ability to realistically monitor a plating process quite frequently, typically on a minute by minute basis.

It will be evident to one skilled in the art that the present monitoring system is also of great advantage because it allows continuous detection of the effect that varying plating parameters have on plating rate. These parameters normally include temperature, reactant concentration, pH, etc.

It must again be stressed that the method and apparatus of the present invention are not restricted to an electroless plating bath which has been discussed herein only for explanatory purposes. They also can be used in electroplating because the A.C. signal of the lock-in amplifier used in the resistance measurement may be superimposed on the D.C. signal used to achieve electroplating. For the electroplating case the monitor of the invention will be of special interest in the deposition of metals and alloys that deposit with efficiencies less than 100 percent (due to hydrogen evolution), such as Ni, NiFe, Co, etc., because for these processes, monitoring of the plating current does not provide a measure of the plating rate.

While the invention has been particularly shown and described with reference to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. In a plating rate monitor system, a resistor bridge circuit comprising:
   first and second resistor means exposed to a plating environment and exhibiting substantially identical resistive characteristics, the resistor means connected as corresponding first and second bridge branches having a common junction and connected between input terminals of the bridge;
   means applied to the second resistor means for preventing the depositing of plating material thereon thus ensuring temperature compensation for the bridge as plating progresses with temperature changes in the plating environment;
   variable resistor means connected in circuit as a third bridge branch, external of the plating environment;
   a fixed resistor connected in circuit as a fourth bridge branch, external of the plating environment, the third and fourth bridge branches having a common junction and connected across the input terminals;
   a first bridge output terminal located at the junction between the first and second branches;
   a second bridge output terminal located at the junction between the third and fourth branches; and
   means connected across the output terminals for measuring the imbalance of the bridge;
   wherein the variable resistor means is periodically incremented by a predetermined value, at each bridge balance condition, thereby upsetting bridge balance, and further wherein the rate of resistance change of the variable resistor means at balance determines plating rate for a succeeding unbalanced bridge interval.

2. The bridge circuit set forth in claim 1 wherein the measuring means comprises:
   analog means having inputs connected to respective output terminals; and
   means connected to the analog means for converting the output thereof to a digital value.

3. The bridge circuit set forth in claim 1 together with:
   control means connected between the output of the converting means and the variable resistor means for incrementing the value of the variable resistor means when each bridge output null occurs.

4. The bridge circuit set forth in claim 1 wherein the variable resistor means comprises a plurality of switchable resistors individually controlled by the control means for adding or subtracting resistance to a resultant binary resistor chain.

5. The bridge circuit set forth in claim 1 wherein the first and second resistor means are formed on a printed circuit board subjectable to a plating environment and comprising:
   a generally U-shaped conductor strip of predetermined resistivity and having respective first and second arm sections and a connective bight section;
   a coating covering the second arm section for preventing the deposition of plating material thereon;
   wherein the outward end portions of the arm sections serve as the bridge input terminals;
   and further wherein the bight section serves as the first bridge output terminal.

6. The bridge circuit set forth in claim 3 wherein the variable resistor means comprises:
   a plurality of switchable resistors individually controlled by the control means for adding or subtracting resistance to a resultant binary resistor chain.

7. In an apparatus for monitoring plating rate, a Wheatstone bridge assembly comprising:
   first and second symmetrical resistive branches of substantially identical resistive characteristics located on a printed circuit board subjectable to a plating environment;
   means covering the second resistive branch for preventing the depositing of material thereon;
   first terminals of each branch being connected at a junction serving as a first bridge output terminal;
   outwardly positioned terminals of the interconnected first and second branches serving as bridge input terminals;
   means for connecting an input signal between the input terminals;
   a fixed resistor and a variable resistor interconnected as respective third and fourth bridge branches external of a plating environment and having a junction therebetween serving as a second bridge output terminal;
   means for connecting outward terminals of the third and fourth branches to the bridge input terminals;
   wherein the resistance of the third branch is substantially higher than the connecting means of the input signal and the connecting means of the third and fourth branches, thereby minimizing the resistive effects of these connecting means.

8. The apparatus set forth in claim 7 together with a lock-in amplifier connected at its input to the bridge output terminals for detecting a balanced bridge condition, the amplifier being phase-locked to an input signal at the bridge input terminals thus providing the bridge with high noise rejection.

9. The apparatus set forth in claim 8 further comprising:
   analog-to-digital converting means having an input thereof connected to an output of the amplifier; and
   control means connected between an output of the converting means and the variable resistor for incrementing the value of the variable resistor as each balanced bridge condition is detected thereby upsetting balance; and further wherein the rate of resistance change of the variable resistor at balance determines plating rate for a succeeding unbalanced bridge interval.

10. In a method for continuously monitoring a plating process with a Wheatstone bridge comprising:
    first and second resistor branches of substantially identical resistive characteristics connected across bridge input terminals;
    variable resistor means connected in circuit as a third bridge branch;
    a fixed resistor connected in circuit as a fourth bridge branch, the third and fourth branches connected across the input terminals;
    bridge output terminals defined
    (a) between the first and second branches and
    (b) between the third and fourth branches,
    the method including the steps:
    subjecting only the first and second branches to an environment in which an object undergoes plating;
    measuring the bridge output voltage as plating progresses;
    detecting the instant when the bridge becomes substantially balanced;
    incrementing the variable resistor means by a preselected amount for unbalancing the bridge as plating of the first branch and the object continues;
    measuring the time interval between successive balanced bridge conditions;
    calculating the plating thickness change during each interval in accordance with the equation:

thickness change $= k \times \Delta R_v / R_f$ where
    $k =$ a constant;
    $\Delta R_v =$ the incremental increase of the variable resistor means; and
    $R_f =$ fixed resistor value;
    and wherein the plating rate is computed as a function of thickness change during an interval divided by the elapsed time of the interval.

11. The method set forth in claim 9 together with the step of covering the second branch with a coating which resists plating thereby retaining the second branch in an original condition during a plating process which provides automatic bridge compensation of plating environment ambient temperature variations.

12. The method set forth in claim 11 together with the steps of:
    collecting a plurality of bridge output data points during an interval between balanced bridge conditions; and
    statistically approximately from the data points when the bridge output voltage is nulled, thereby defining the elapsed time for a corresponding interval from which plating rate during that interval may be determined.

13. The method set forth in claim 12 wherein the variable resistor means is a binary chain resistor having switchable sections corresponding to binary bit positions, the method including the steps of:
    incrementing the variable resistor means during successive intervals by increasing the resistance thereof in an amount equal to the resistance value of the least significant bit section;
    detecting when the least significant bit section is switched out; and
    adjusting the value of the incremented variable resistance means existing during such a switching out, in accordance with the equation $\Delta R_v = \Delta R_{vp} \times (\Delta v / \Delta v_p)$ where
    $\Delta R_v =$ incremented variable resistance when the least significant bit section is switched out;
    $\Delta R_{vp} =$ incremented resistance during an immediately preceding interval, when the least significant bit section was switched in;
    $\Delta v =$ output voltage change when the least significant bit section is switched out;
    $\Delta v_p =$ output voltage change when the least significant bit section was switched in, during an immediately preceding interval.

14. The method set forth in claim 13 together with the steps of:
    comparing a present plating rate with preselected limits; and
    alerting an operator in the event the rate is outside the range of the preselected limits.

* * * * *

UNITED STATES PATENT AND TRADEMARK OFFICE
CERTIFICATE OF CORRECTION

PATENT NO. : 4,479,980
DATED : October 30, 1984
INVENTOR(S) : Raul E. Acosta and Edward J. Yarmchuk It is certified that error appears in the above—identified patent and that said Letters Patent is hereby corrected as shown below:

Column 5, line 64 should read:

$$\Delta T = (p_m L_m / w_m R_r) \times (250\Omega/10,000 R_f)$$

Column 12, line 18, "approximately" should be

--approximating--.

Signed and Sealed this

Fourteenth Day of May 1985

[SEAL]

Attest:

DONALD J. QUIGG

Attesting Officer     Acting Commissioner of Patents and Trademarks